United States Patent
Sakurai et al.

(10) Patent No.: US 10,339,255 B2
(45) Date of Patent: Jul. 2, 2019

(54) PROGRAM DEVELOPMENT SUPPORT DEVICE, NON-TRANSITORY STORAGE MEDIUM STORING THEREON COMPUTER-READABLE PROGRAM DEVELOPMENT SUPPORT PROGRAM, AND PROGRAM DEVELOPMENT SUPPORT METHOD

(71) Applicant: OMRON Corporation, Kyoto-shi, Kyoto (JP)

(72) Inventors: Hiroko Sakurai, Kusatsu (JP); Nobuyuki Takuma, Kusatsu (JP); Ryosuke Fujimura, Kusatsu (JP); Hiromu Suganuma, Ritto (JP); Asahi Matsui, Takatsuki (JP)

(73) Assignee: OMRON CORPORATION, Kyoto-shi, Kyoto (JP)

( * ) Notice: Subject to any disclaimer, the term of this patent is extended or adjusted under 35 U.S.C. 154(b) by 45 days.

(21) Appl. No.: 15/413,622

(22) Filed: Jan. 24, 2017

(65) Prior Publication Data
US 2017/0262568 A1    Sep. 14, 2017

(30) Foreign Application Priority Data
Mar. 14, 2016    (JP) ................ 2016-049498

(51) Int. Cl.
*G06F 17/50* (2006.01)
*G06F 8/61* (2018.01)
(Continued)

(52) U.S. Cl.
CPC ....... *G06F 17/5077* (2013.01); *G05B 19/042* (2013.01); *G05B 19/0425* (2013.01);
(Continued)

(58) Field of Classification Search
USPC ............... 700/86, 80, 274, 276; 716/139
See application file for complete search history.

(56) References Cited

U.S. PATENT DOCUMENTS

| | | | | |
|---|---|---|---|---|
| 2009/0024230 A1* | 1/2009 | Hioka | ............... | G05B 19/0426 700/17 |
| 2012/0004744 A1* | 1/2012 | Reusch | ............. | G05B 19/0426 700/86 |

(Continued)

FOREIGN PATENT DOCUMENTS

| | | |
|---|---|---|
| CN | 102411331 A | 4/2012 |
| CN | 105139071 A | 12/2015 |

(Continued)

OTHER PUBLICATIONS

Phoenix Contact: "UM EN PSR-TRISAFE-S User Manual", Jun. 22, 2011, Retrieved from the Internet: URL: http://select.phoenixcontact.com/phoenix/dwld/um_en_psr_trisafe_s_103503_en_03.pdf?=y&asid2=361882380953333 (102 pages total).

(Continued)

*Primary Examiner* — Brian Ngo
(74) *Attorney, Agent, or Firm* — Sughrue Mion, PLLC

(57) ABSTRACT

A program development support device includes: a first display control module that displays, in response to selection of any input/output unit connected to the safety controller, a first image object representing an external appearance and input/output terminals of the selected input/output unit; and a second display control module that displays, together with the first image object, a second image object representing a safety device and a circuit configuration of the safety device, the safety device being set to be allocated to any of the input/output terminals of the selected input/output unit. For an input/output terminal to which each safety device is allocated, the input/output terminal represented by the first image object and the circuit configuration represented by the (Continued)

second image object are displayed in association with each other by the program development support device.

17 Claims, 12 Drawing Sheets

(51) Int. Cl.
*G05B 19/042* (2006.01)
*G06F 8/34* (2018.01)
*G06F 9/445* (2018.01)
*G06F 3/0481* (2013.01)
*G06F 3/0482* (2013.01)
*G06F 3/0484* (2013.01)

(52) U.S. Cl.
CPC ............... *G06F 8/34* (2013.01); *G06F 8/61* (2013.01); *G06F 9/44505* (2013.01); *G06F 3/0482* (2013.01); *G06F 3/04817* (2013.01); *G06F 3/04842* (2013.01)

(56) References Cited

U.S. PATENT DOCUMENTS

| 2013/0138227 | A1* | 5/2013 | Gohr | G05B 9/02 |
| | | | | 700/80 |
| 2016/0091204 | A1* | 3/2016 | Patton | G05B 19/054 |
| | | | | 700/274 |
| 2016/0091205 | A1* | 3/2016 | Solosky | F23N 5/082 |
| | | | | 431/2 |
| 2016/0091903 | A1* | 3/2016 | Patton | F23N 5/203 |
| | | | | 700/276 |

FOREIGN PATENT DOCUMENTS

| CN | 105144003 A | 12/2015 |
| EP | 2 098 926 A1 | 9/2009 |
| JP | H09-81378 A | 3/1997 |
| JP | 2000-137509 A | 5/2000 |
| JP | 2001-337706 A | 12/2001 |
| JP | 2014-137621 A | 7/2014 |

OTHER PUBLICATIONS

Communication dated Aug. 28, 2017, from the European Patent Office in counterpart European Application No. 17152227.9.
Communication from Japanese Patent Office dated Aug. 28, 2018 issued in corresponding Japanese Application 2016-049498.
Communication dated Jan. 22, 2019 from the State Intellectual Property Office of the P.R.C. in application No. 201710024918.3.
User Manual "UM EN PSR-TRISAFE: Device description, configuration, and startup of the PSR-TRISAFE-S safety module", 2009, 15 pages.

* cited by examiner

US 10,339,255 B2

PROGRAM DEVELOPMENT SUPPORT DEVICE, NON-TRANSITORY STORAGE MEDIUM STORING THEREON COMPUTER-READABLE PROGRAM DEVELOPMENT SUPPORT PROGRAM, AND PROGRAM DEVELOPMENT SUPPORT METHOD

BACKGROUND OF THE INVENTION

Field of the Invention

The present technique relates to a program development support device, a non-transitory storage medium storing thereon a computer-readable program development support program, and a program development support method for supporting development of a safety program to be executed in a safety controller.

Description of the Background Art

In order to safely use machines for use at many manufacturing sites, safety equipment (safety components) in compliance with international standards should be used. The safety equipment is intended to prevent people's safety from being threatened by automatically moving devices such as robots. Such safety equipment includes a safety controller which executes a safety program, as well as detection equipment which detects the presence or intrusion of a person, input equipment which receives operation in case of emergency, output equipment which actually stops the equipment, and the like.

Japanese Patent Laying-Open No. 2014-137621 for example discloses, as one of techniques ensuring safety at such manufacturing sites, a method for supporting designing of a user program for a safety controller that can facilitate designing of the user program for the safety controller.

Japanese Patent Laying-Open No. 2014-137621 discloses a configuration in which a safety controller and a safety I/O terminal are connected through a bus-type network, and the safety controller outputs a command for allowing a safety operation to be performed, to safety output equipment which is connected to the safety I/O terminal, based on an input signal from safety input equipment which is connected to the safety I/O terminal.

SUMMARY OF THE INVENTION

When the safety controller is to be actually installed, it is necessary to design and implement electrical connections between safety components and input/output terminals. The above-referenced Japanese Patent Laying-Open No. 2014-137621 only discloses allocation of variables in software, and does not mention at all electrical interconnections between safety components and the safety controller.

Therefore, there is a demand for a configuration supporting designing of not only internal variables in software but also designing of an electrical circuit configuration.

In accordance with an embodiment, there is provided a program development support device for supporting development of a safety program to be executed in a safety controller. The program development support device includes: a first display control module that displays, in response to selection of any input/output unit connected to the safety controller, a first image object representing an external appearance and input/output terminals of the selected input/output unit; and a second display control module that displays, together with the first image object, a second image object representing a safety device and a circuit configuration of the safety device, the safety device being set to be allocated to any of the input/output terminals of the selected input/output unit. For an input/output terminal to which each safety device is allocated, the input/output terminal represented by the first image object and the circuit configuration represented by the second image object are displayed in association with each other by the program development support device.

The program development support device may further include a module that allocates, in response to selection of any safety device from a plurality of safety devices prepared in advance, the selected safety device to an input/output terminal of the input/output unit.

The first display control module may vary a manner of displaying the input/output terminals of the first image object, depending on a type of the safety device allocated to the input/output unit.

The first image object may include, as the external appearance of the input/output unit corresponding to the first image object, one or more partial image objects each representing an input/output terminal. The first display control module may vary, depending on a type of the safety device allocated to the input/output unit, a manner of displaying a corresponding partial image object.

The first image object may include, as the external appearance of the input/output unit corresponding to the first image object, one or more partial image objects each representing an input/output terminal. The one or more partial image objects may represent a direction of a signal to be delivered to/from the safety device allocated to the input/output unit.

The program development support device may further include an output module that outputs a document including the first image object and the second image object.

The program development support device may further include a storage module that stores a setting regarding allocation of the safety device to the selected input/output unit.

In accordance with an embodiment, there is provided a non-transitory storage medium storing thereon a computer-readable program development support program for supporting development of a safety program to be executed in a safety controller. The program development support program causes a computer to execute: displaying, in response to selection of any input/output unit connected to the safety controller, a first image object representing an external appearance and input/output terminals of the selected input/output unit; and displaying, together with the first image object, a second image object representing a safety device and a circuit configuration of the safety device, the safety device being set to be allocated to any of the input/output terminals of the selected input/output unit. For an input/output terminal to which each safety device is allocated, the input/output terminal represented by the first image object and the circuit configuration represented by the second image object are displayed in association with each other.

In accordance with an embodiment, there is provided a program development support method for supporting development of a safety program to be executed in a safety controller. The program development support method includes: displaying, in response to selection of any input/output unit connected to the safety controller, a first image object representing an external appearance and input/output terminals of the selected input/output unit; and displaying, together with the first image object, a second image object representing a safety device and a circuit configuration of the safety device, the safety device being set to be allocated to any of the input/output terminals of the selected input/output unit. For an input/output terminal to which each safety device is allocated, the input/output terminal represented by the first image object and the circuit configuration represented by the second image object are displayed in association with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
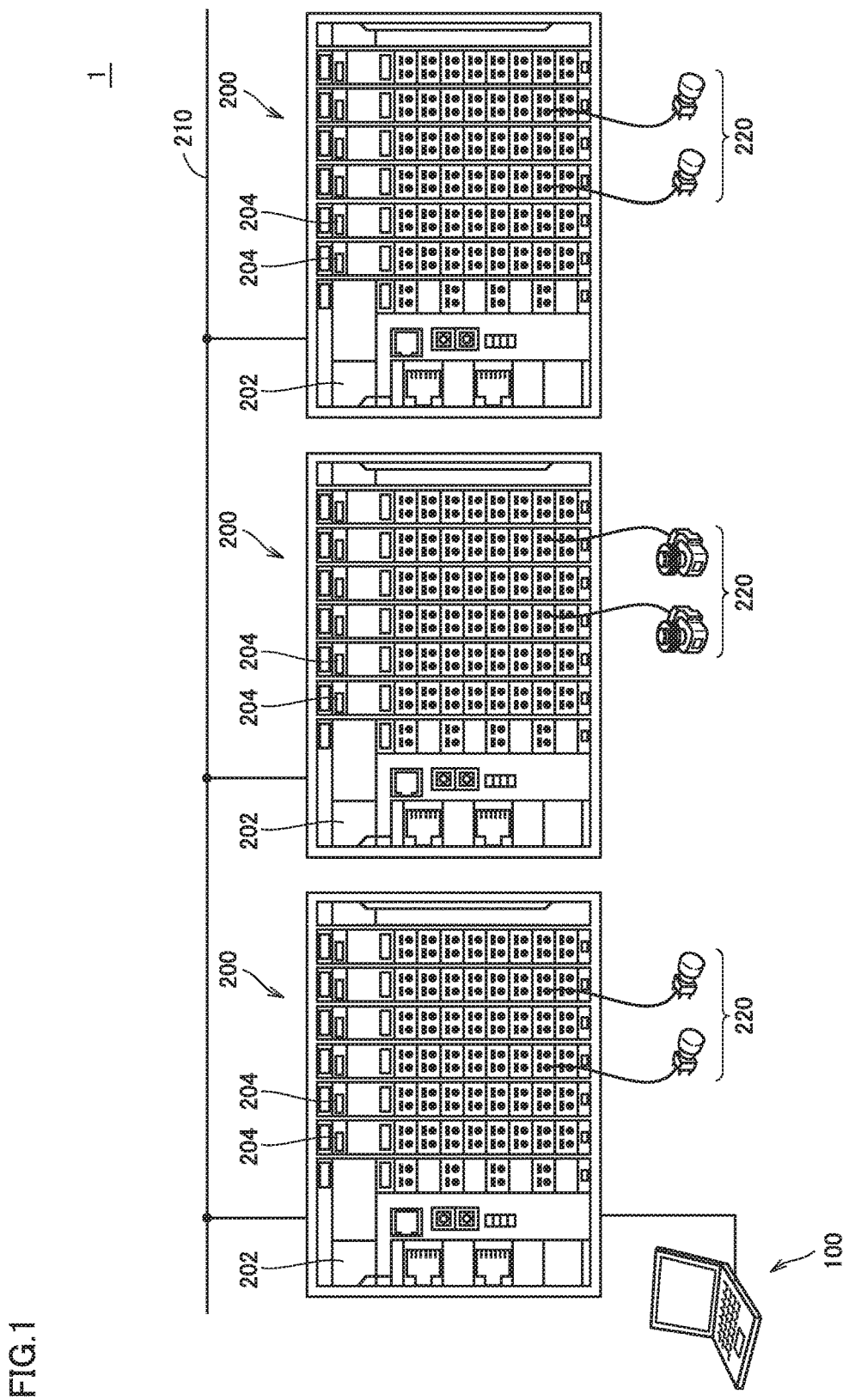
FIG. 1 is a schematic view showing an overview of a safety system in accordance with the present embodiment.

Embodiments of the present invention will be described in detail with reference to the drawings. It should be noted that identical or corresponding parts in the drawings will be designated by the same reference numerals, and the description thereof will not be repeated.

<A. Overview of Safety System>

First, with reference to FIG. 1, an overview of a safety system including a safety controller(s) in accordance with the present embodiment will be described.

Safety system 1 includes one or more safety controllers 200. While FIG. 1 shows an example where a plurality of safety controllers 200 are configured to be capable of exchanging data with one another through a network 210, a single safety controller 200 may alternatively be used.

Safety controller 200 includes a main arithmetic unit 202 and one or more input/output units 204. Main arithmetic unit 202 is a mechanism which is responsible for the overall arithmetic processing in safety controller 200, and configured to perform collection of field data through input/output unit 204, execution of a safety program, output of a command value through input/output unit 204, and the like.

To safety controller 200, various types of safety components are to be connected. The following description will be focused on allocation and electrical connection of safety components to input/output unit 204, and therefore, safety components to be allocated or electrically connected are generally referred to as "safety device." Depending on the context, "safety device" may encompass all safety components.

"Input/output unit" herein generally refers to components exchanging a signal with an actual safety device, and includes all of a unit (input unit) having only the function of receiving a signal from the safety device, a unit (output unit) having only the function of transmitting a signal to the safety device, and a unit (input/output unit) having both these functions in combination. Moreover, types of signals (electrical signal and optical signal for example) to be delivered to/from the safety device, signal waveforms (DC waveform, AC waveform, and pulse waveform, for example), signal amplitudes (oscillating voltage for example), and the like are not limited to specific ones, and a signal of a certain type and certain characteristics appropriate for an employed safety device is used.

As to the safety components (safety device 220), examples of the input device may include emergency-stop push-button switch, safety sensor, safety light curtain, safety laser scanner, safety door switch, safety limit switch, safety mat, enable switch, and the like, and examples of the output device may include safety relay unit, safety relay, and the like.

While FIG. 1 shows a configuration where a plurality of safety controllers 200 are network-connected, a remote input/output device may be network-connected to a single safety controller 200 and an input/output unit mounted on the remote input/output device may be connected to safety device 220. In such a case, the remote input/output device is equipped with, instead of main arithmetic unit 202, a network coupler configured to mainly communicate with main arithmetic unit 202.

A program development support device (hereinafter also abbreviated as "support device") 100 in accordance with the present embodiment has a function of supporting development of a safety program to be executed in the safety controller. Support device 100 is configured to develop a safety program and configured to be connected to any safety controller 200 to be capable of transferring the developed safety program, for example. It should be noted that support device 100 may not necessarily be connected to safety controller 200, and support device 100 is capable of providing the following program development support function even in the so-called offline state.

<B. Hardware Configuration of Program Development Support Device>

Figure 2:
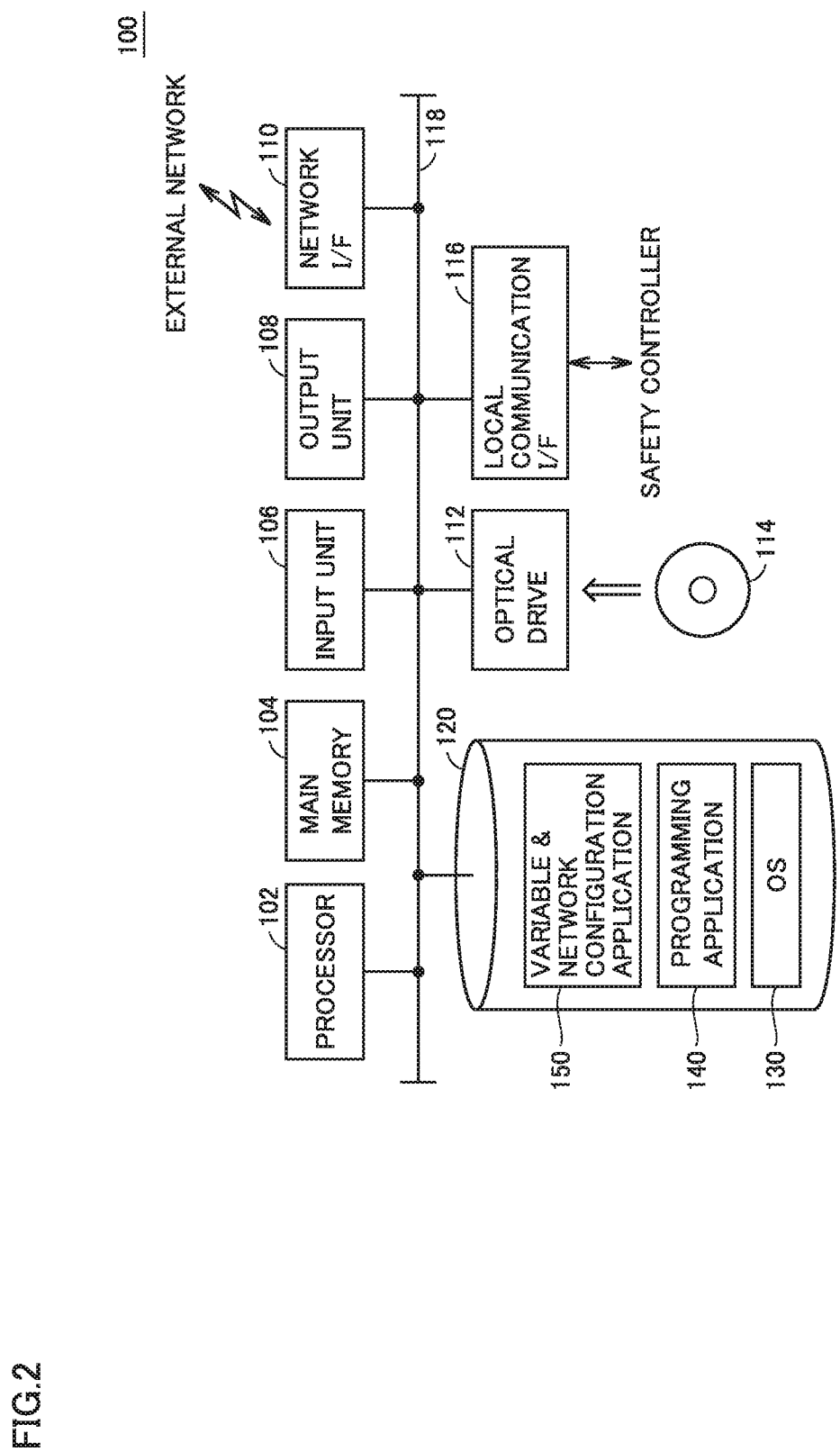
FIG. 2 is a schematic view showing an example of a hardware configuration of a support device in accordance with the present embodiment.

Next, a hardware configuration of support device 100 will be generally described. FIG. 2 shows an example of the hardware configuration of support device 100 in accordance with the present embodiment.

Support device 100 in accordance with the present embodiment shown in FIG. 2 may typically be implemented through installation of software as described later herein in a general-purpose computer and execution of the software.

Specifically, support device 100 includes, as its main components, a processor 102 executing a program described later herein, a main memory 104 providing a work area for storing data necessary for execution of the program by processor 102, an input unit 106 receiving user's manipulation of a keyboard, mouse, or the like, an output unit 108 which outputs results of processing, such as display, various types of indicators, printer, and the like, a network interface (I/F) 110 for communicating with an external network, an optical drive 112, a local communication interface (I/F) 116 for communicating with the safety controller for example, and an auxiliary storage device 120. These components are connected so that they are capable of data communication with one another through an internal bus 118 or the like.

Support device 100 has optical drive 112 to read various programs from a computer-readable storage medium 114 such as optical storage medium (DVD (Digital versatile Disc) or the like for example) which non-transitorily stores a computer-readable program, and install the read programs in auxiliary storage device 120 or the like. The program development support function in accordance with the present embodiment may be provided as a part of a development environment program which provides functions such as setting, programming, debugging for the safety controller.

While various programs to be executed in support device 100 may be installed through computer-readable storage medium 114, the programs may alternatively be installed by being downloaded from a server device or the like on the network. Moreover, programs for the program development support in accordance with the present embodiment may alternatively be implemented through use of a part of modules provided by an OS. In such a case, all the software modules necessary for implementing the program development support in accordance with the present embodiment are not distributed, but only a part of the modules is distributed. Even in such a case, apparently this is encompassed by the technical scope of the present invention. Moreover, processing for the program development support in accordance with the present embodiment may be implemented as a part of another program or software.

Auxiliary storage device 120 is configured for example as HDD (Hard Disk Drive), SSD (Flash Solid State Drive), or the like, and stores, in non-volatile manner, programs to be executed by processor 102 and/or various kinds of data. Specifically, auxiliary storage device 120 includes, in addition to an operating system (OS) 130, a programming application 140 and a variable and network configuration application 150 as programs which provide functions as will be described later herein. The functions and processing provided by these programs will be described later herein.

FIG. 2 shows a configuration where a general purpose computer executes a program to implement functions for the program development support in accordance with the present embodiment. Instead of such a configuration, the whole or a part of the configuration may be implemented by hardwired circuits. For example, functions provided through execution of the aforementioned various programs by processor 102 may be implemented by means of an ASIC (Application Specific Integrated Circuit) or FPGA (Field-Programmable Gate Array).

<C. Software Configuration of Program Development Support Device>

Figure 3:
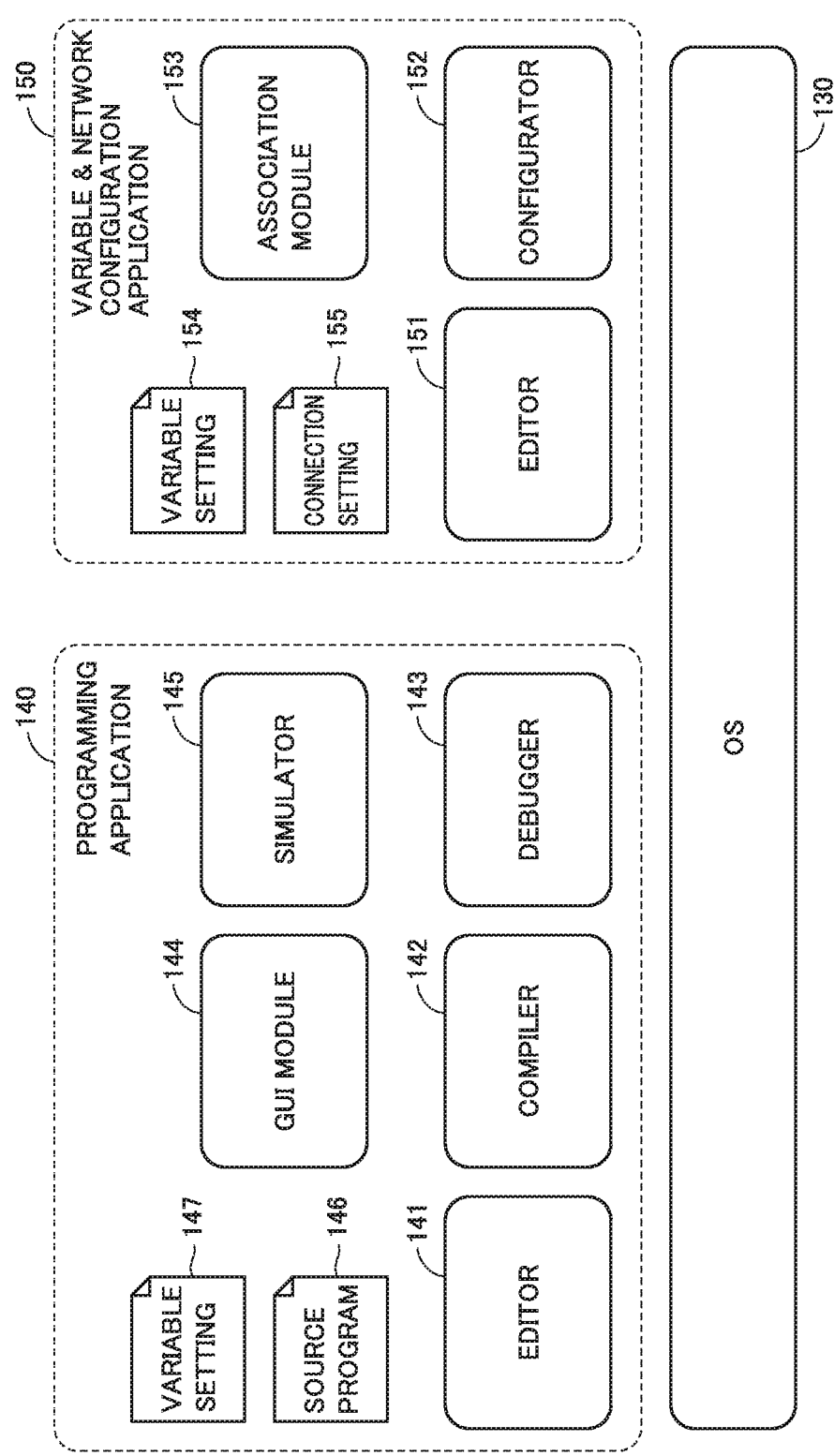
FIG. 3 is a schematic view showing an example of a software configuration of the support device in accordance with the present embodiment.

Next, a software configuration of support device 100 will be generally described. FIG. 3 shows an example of the software configuration of support device 100 in accordance with the present embodiment.

Referring to FIG. 3, support device 100 includes, as its software configuration, programming application 140 and variable and network configuration application 150 which are to be executed on OS 130. These programming application 140 and variable and network configuration application 150 mainly provide the function of supporting development of a safety program to be executed in the safety controller. Namely, programming application 140 and variable and network configuration application 150 function as a program development support program.

Respective modules included in programming application 140 and variable and network configuration application 150 are typically distributed in the state of being stored on storage medium 114, and installed in support device 100.

Programming application 140 is an application providing functions for producing a safety program to be executed in the safety controller. More specifically, programming application 140 includes an editor 141, a compiler 142, a debugger 143, a GUI (Graphical User Interface) module 144, and a simulator 145.

Editor 141 provides functions such as input function and edit function for producing a safety program (source program 146). More specifically, editor 141 provides a function for allowing a user to manipulate a keyboard and/or a mouse and produce source program 146 of the safety program, and additionally provides a function for storing the produced source program 146 and a function for editing the produced source program 146. Compiler 142 compiles the safety program to generate a code in the form (in object form for example) executable in the safety controller. Debugger 143 provides a function for debugging the safety program (source program 146). GUI module 144 provides a user interface for allowing a user to input various kinds of set values. Simulator 145 creates, in support device 100, an environment for simulating execution of a program in the safety controller.

Source program 146 which is produced by programming application 140 and variable setting 147 which is set by a user and necessary for execution of a program are also stored.

Variable and network configuration application 150 provides a function of making a setting for a signal to be input to or output from the safety controller and a setting for a signal to be exchanged between safety controllers. More specifically, variable and network configuration application 150 includes an editor 151, a configurator 152, and an association module 153.

Editor 151 provides functions such as a function of inputting and a function of editing a setting for a variable such as setting of the type and allocation of a signal which is to be input to or output from the safety controller, as well as a setting for network connection or the like between safety controllers. The functions provided by editor 151 will be described later herein. Information produced by editor 151 is stored as variable setting 154. Configurator 152 provides a function of supplying a setting necessary for exchanging data between safety controllers, to a target safety controller. The information provided by configurator 152 is stored as connection setting 155.

Association module 153 provides a function of associating target safety controllers with one another for each piece of data to be exchanged. More specifically, association module 153 associates a signal which is allocated to each input/output unit based on variable setting 154, with information of connection setting 155, so that the signal is available to other safety controllers.

<D. Exemplary Setting Operation for Input/Output Unit>

Next, a description will be given of an exemplary setting operation for the input/output unit that is provided on support device 100 in accordance with the present embodiment.

FIGS. 4 to 10 each show an example of a user interface screen 300 provided by support device 100 in accordance with the present embodiment. In the following, with reference to FIGS. 4 to 10, a description will be given of an exemplary operation for user's setting (hereinafter also referred to as "I/O setting") for allocating a safety device to an input/output unit of a safety controller.

Figure 4:
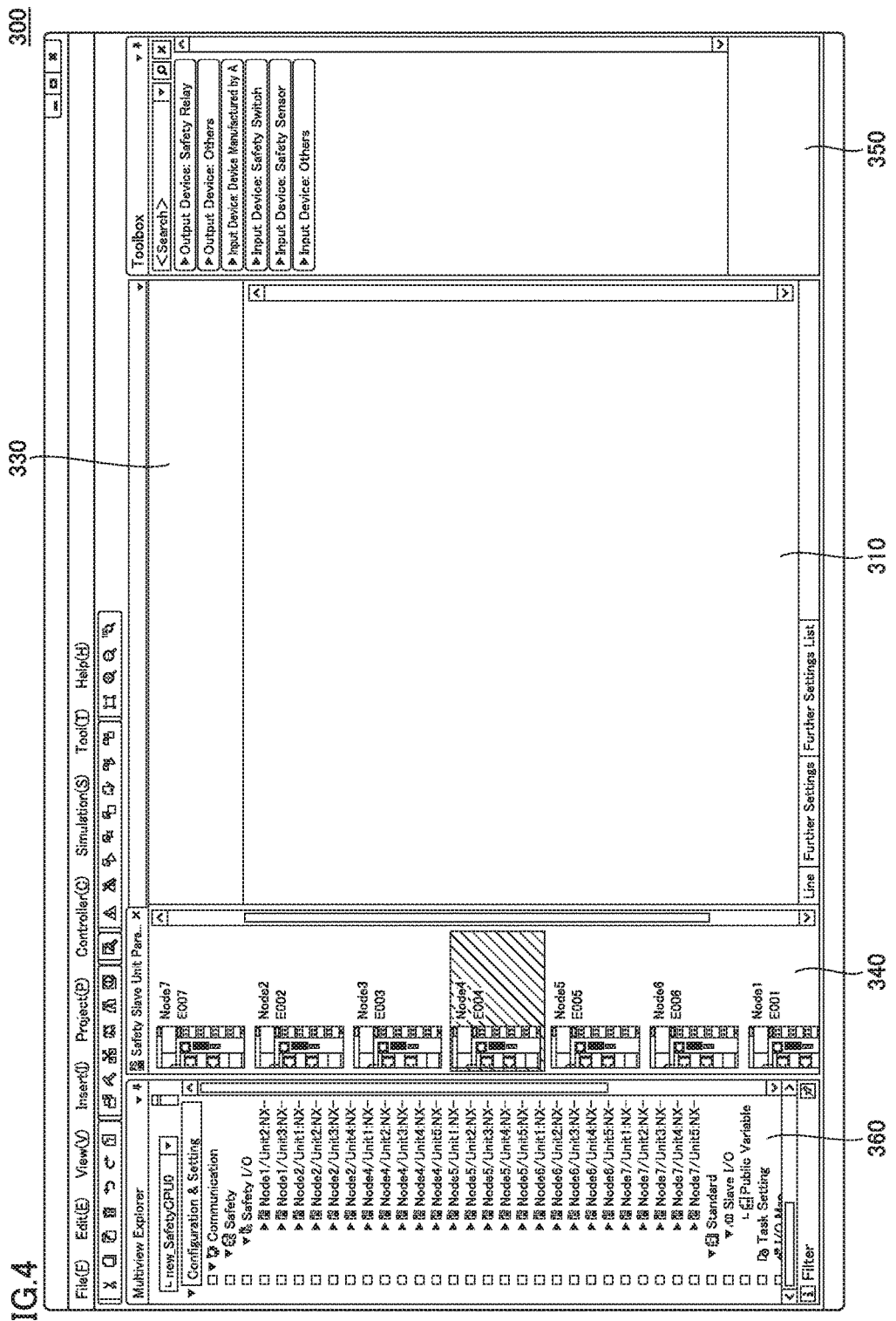
FIGS. 4 to 10 are each a schematic view showing an example of a user interface screen provided by the support device in accordance with the present embodiment.

In FIG. 4, an example of the initial state of user interface screen 300 for the I/O setting is shown. User interface screen 300 includes a unit status display area 310 indicating a status of allocation of a safety device to each input/output unit, a device display area 330 for displaying a selected safety controller or remote input/output device, an equipment list display area 340 displaying, in a list form, selectable safety controllers and/or remote input/output devices included in the safety system, and a device list display area 350 displaying, in a list form, safety devices which can be allocated to input/output units. Moreover, user interface screen 300 may include a multiview explorer 360 by which current setting details can be confirmed hierarchically.

Initially, from the devices displayed in the list form in equipment list display area 340, a user selects a target device for which a setting is to be made. In equipment list display area 340, one or more icons (image objects) corresponding to the types of devices are displayed in accordance with a network setting made in advance. The user manipulates a mouse or the like to select an icon corresponding to the target device and thereby validate a setting for the selected device. On the icons displayed in equipment list display area 340, setting information about the corresponding device may be indicated.

Figure 5:
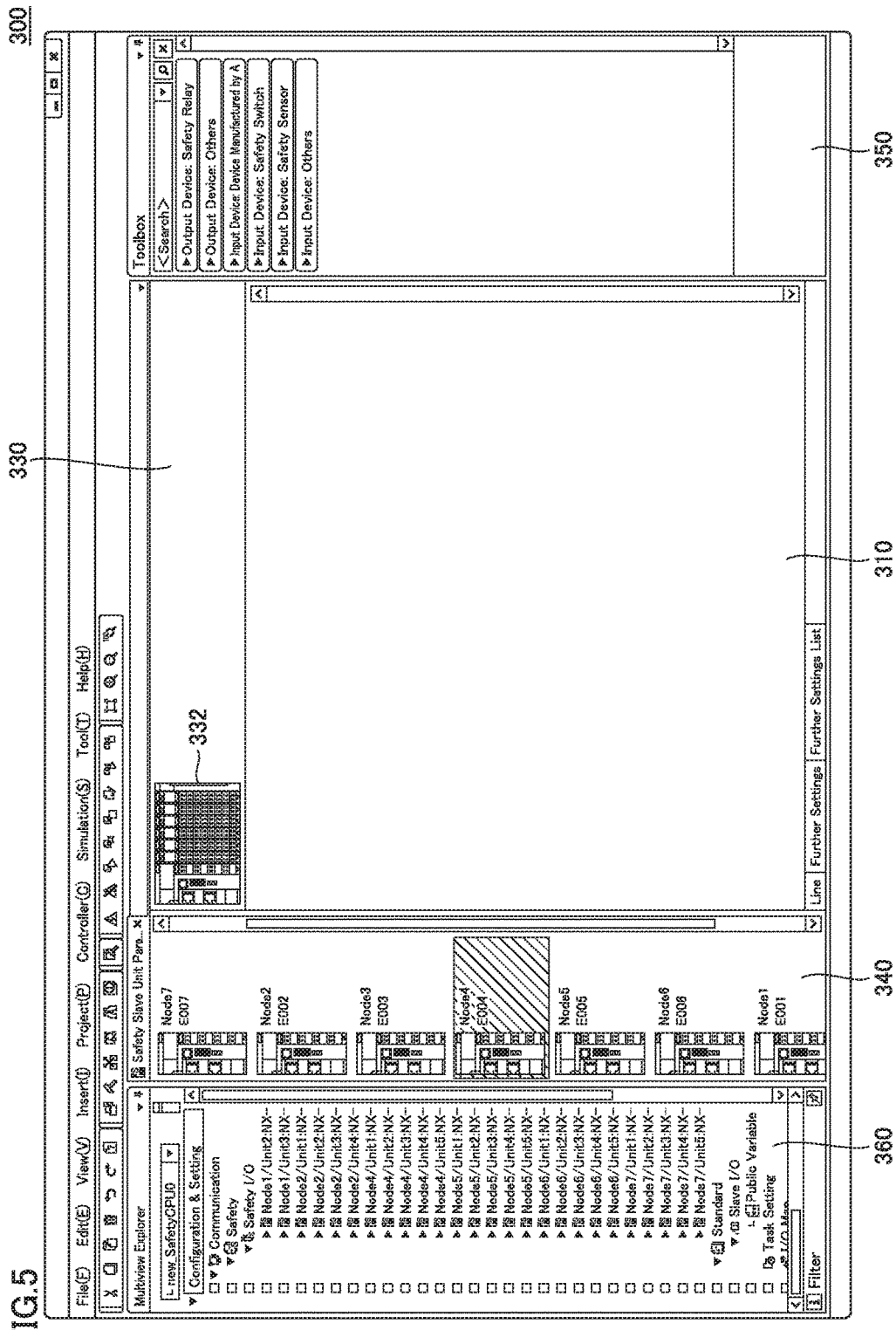

Upon selection of any device from the devices displayed in the list form in equipment list display area 340, an icon 332 (image object) showing the configuration of the selected device is displayed in device display area 330 as shown in FIG. 5. This icon 332 reflects the state of mounted input/output units, based on information about the configuration of the selected device.

Further, the user selects a portion, which corresponds to an input/output unit for which a setting is to be made, of icon 332 displayed in device display area 330. Then, as shown in FIG. 6, image objects 312 and 314 which visually show information about settings for the selected input/output unit are displayed in unit status display area 310.

Image objects 312 and 314 (first image object) are displayed in response to selection of any input/output unit connected to the safety controller, and represent an external appearance and input/output terminals of the selected input/output unit. In FIG. 6, a combination of image object 312 and image object 314 is used. The image objects, however, are not limited to this combination. Image objects represented in any form may be used as long as the external appearance and input/output terminals of the selected input/output unit can be represented.

Image object 312 schematically shows a surface where terminals of the selected input/output unit are arranged and, at respective positions of the input/output terminals, the terminals are indicated each in a circular shape. The circular portions representing respective terminals are displayed differently depending on the function (input or output) of each terminal. For example, the terminals may be displayed differently by different colors, gradations, hatchings, or shapes, or by flashing and non-flashing.

Figure 6:
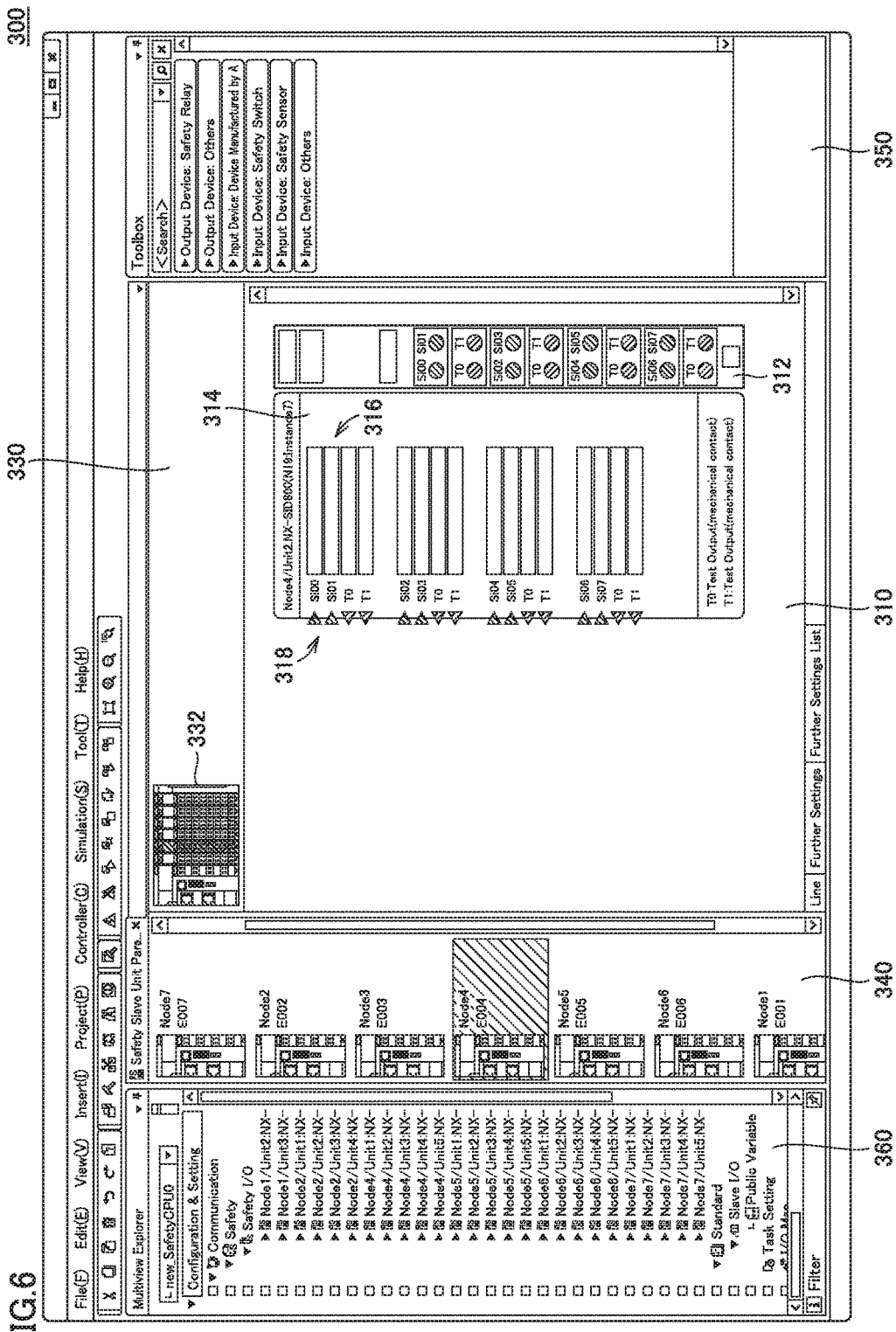

In FIG. 6, an example of the input/output unit to which four safety devices are connectable is shown. For each safety device, two signal inputs and two test outputs are included. For example, a group of terminals arranged in the uppermost region of the input/output unit is constituted of input terminals S100 and S101 to which two signals are to be input and test output terminals T0 and T1 to which two testing voltages/currents are to be supplied. Based on whether or not a voltage/current is input to input terminals S100 and S101 or based on the magnitude of a voltage/current which is input thereto, it is determined whether or not signals are input thereto. Test output terminals T0 and T1 output a dummy signal for detecting disconnection and/or contact welding of a safety device to which the input/output unit is connected.

Image object 314 schematically shows information about a safety device connected to the input/output unit as well as a circuit configuration. More specifically, image object 314 includes a comment box 316 receiving input of a comment for each connected safety device, and a terminal display object 318 showing a state of a terminal connected to the safety device. The manner of displaying terminal display object 318 preferably conforms to the manner of displaying the corresponding terminal in image object 312.

Figure 7:
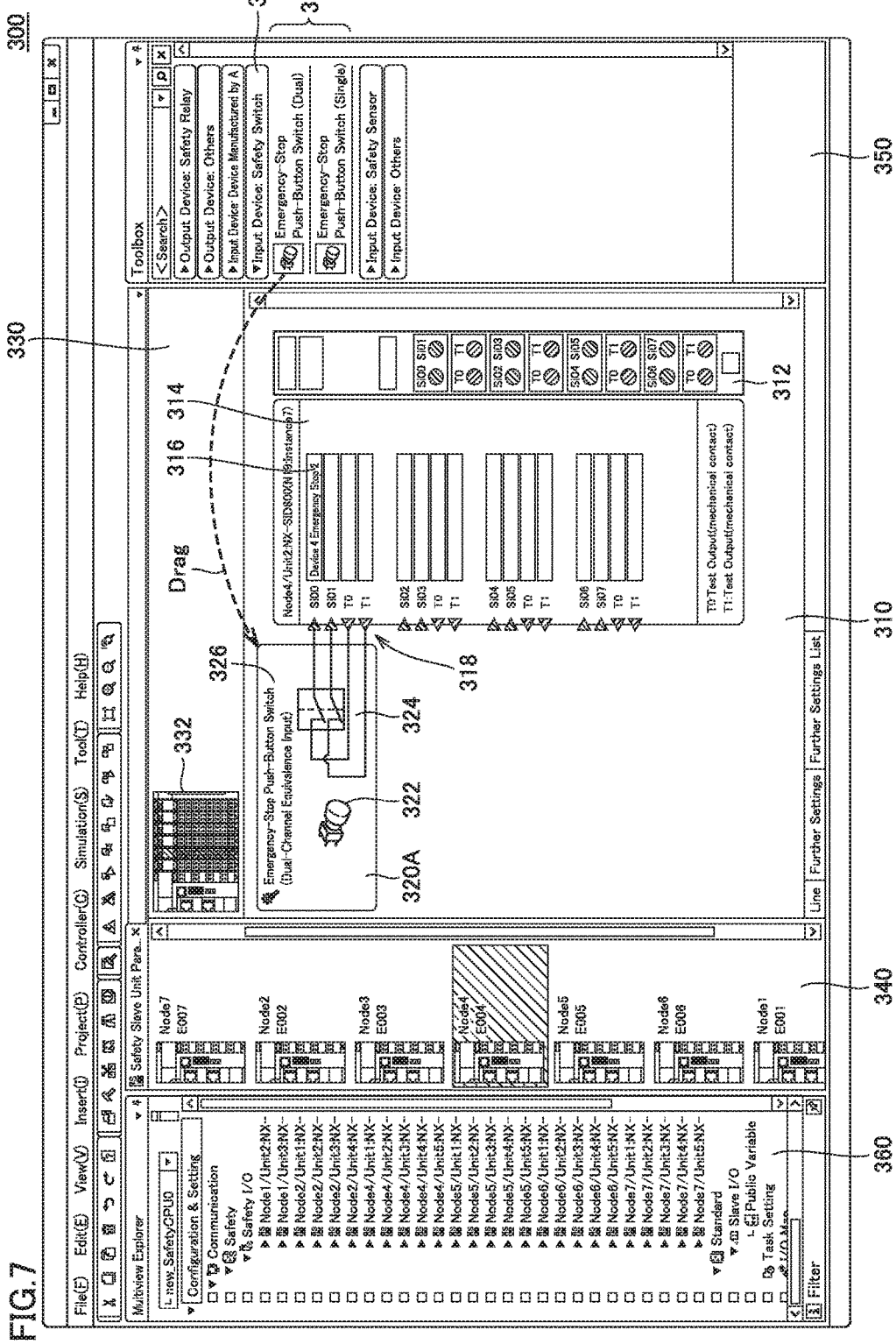

In the state as shown in FIG. 6, a user selects, from device list display area 350, a safety device to be allocated to the target input/output unit. As shown in FIG. 7, a plurality of buttons 352 for respective types of safety devices are displayed in device list display area 350. The user selects a button representing the type of safety device to be allocated, and selects a target safety device from one or more safety devices displayed in the form of a pull-down menu in response to the selection of the button. Then, the user drags the target safety device in device list display area 350 to the position of corresponding terminals of image object 314. Accordingly, as shown in FIG. 7, the selected safety device is allocated to the terminals adjacent to the position to which the safety device is dragged.

As any safety device is allocated by this dragging operation, an image object 320A representing the allocated safety device is displayed in association with image object 314.

Image object 320A (second image object) is displayed together with image objects 312 and 314 (first image object) to represent the safety device which is set to be allocated to any of the input/output terminals of the selected input/output unit and represent a circuit configuration of the safety device. More specifically, image object 320A includes an image object 322 showing the external appearance of the safety device allocated to any input/output terminals, and an image object 324 showing the circuit configuration of the allocated safety device. In image object 320A, further the name ("Emergency-Stop Push-Button Switch (Dual-Channel Equivalence Input)" in the example shown in FIG. 7) of the type of the allocated safety device may additionally be displayed.

As shown in FIG. 7, for an input/output terminal to which each safety device is allocated, the input/output terminal (terminal display object 318) indicated by image object 314 and the circuit configuration (image object 324) indicated by image object 320A are displayed in association with each other. Namely, by optimization of the positions where image object 314 and image object 320A are arranged relative to each other, electrical connection (circuit connection) between each input/output terminal of the input/output unit and the allocated safety device can be visually recognized.

Moreover, in response to the allocating operation of the safety device, a preset comment about the allocated safety device may be automatically input to comment box 316 of image object 314.

Figure 8:
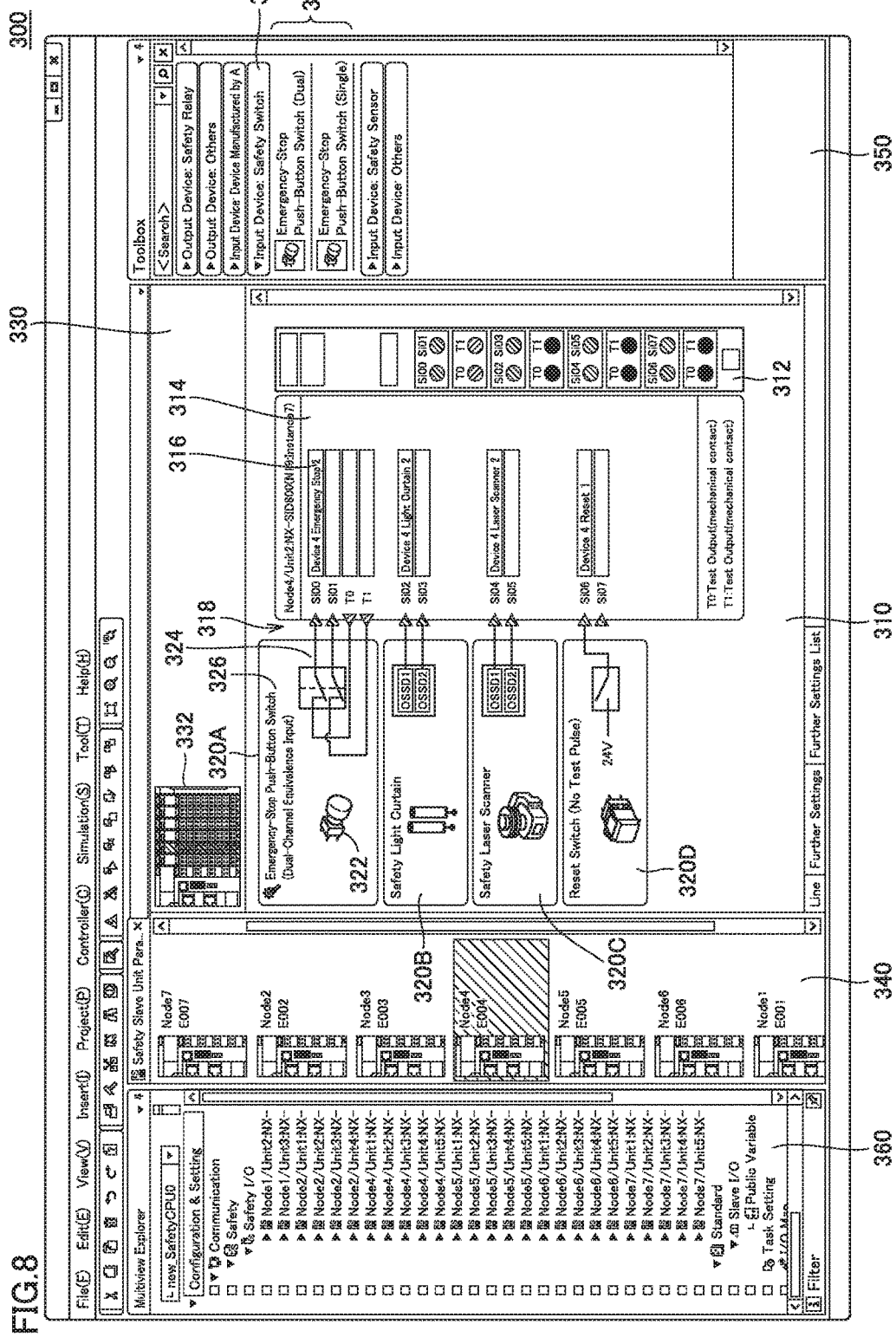

A similar operation to the allocating operation for the safety device shown in FIG. 7 is repeated successively, and accordingly allocation of one or more safety devices to the selected input/output unit is completed as shown in FIG. 8. FIG. 8 shows a state in which image objects 320A to 320D which indicate respective four safety devices allocated to the selected input/output unit are displayed.

In this way, in response to selection of any safety device from a plurality of safety devices prepared in advance, a process of allocating the selected safety device to an input/output terminal of the input/output unit is performed. Since various safety devices may be connected to the actual input/output unit, preferably device list display area 350 is configured to allow as many safety devices as possible to be selectable, based on information acquired in advance.

As to the safety devices displayed in device list display area 350, support device 100 may access a server device through the network or the like to acquire the latest information about safety devices and accordingly dynamically change the displayed contents.

As shown in FIG. 8, depending on the type of the allocated safety device, only a part of the input/output terminals prepared on the input/output unit may be used. Therefore, depending on the type of the safety device allocated to the input/output unit, the manner of displaying the input/output terminals (terminal display objects 318) of image object 314 may be varied. For example, by not displaying unnecessary terminals, understanding of the relation of connection between the terminals and the safety device can be facilitated. Therefore, as shown in FIG. 8, for a safety device (such as safety light curtain, safety laser scanner, reset switch, or the like in the example shown in FIG. 8) which does not require test output terminals T0 and T1 for example, it is preferable not to display, on image object 314, terminal display objects 318 for these terminals.

While FIG. 7 exemplarily shows an example configuration where the safety device is allocated by the dragging from device list display area 350 to the position of target terminals, the manner of allocation is not limited to this. The safety device may alternatively be allocated by the so-called "copy-and-paste." Namely, when a safety device is allocated to a certain terminal and thereafter the same safety device as the allocated safety device is to be allocated to another terminal, the formerly allocated safety device may be "copied" and "pasted" at the position of the other terminal to which the safety device is to be newly allocated. Thus, the formerly allocated safety device is duplicated and allocated to the other terminal. Still another operation may also be permitted.

As shown in FIGS. 6 to 8, objects each in a triangular shape are employed as terminal display objects 318. By the direction of the triangular shape, whether a corresponding input/output terminal of the input/output unit is used as an input terminal or an output terminal is indicated. Thus, terminal display object 318 (partial image object) is configured to represent a direction of a signal to be delivered to/from the safety device allocated to the input/output unit.

Figure 9:
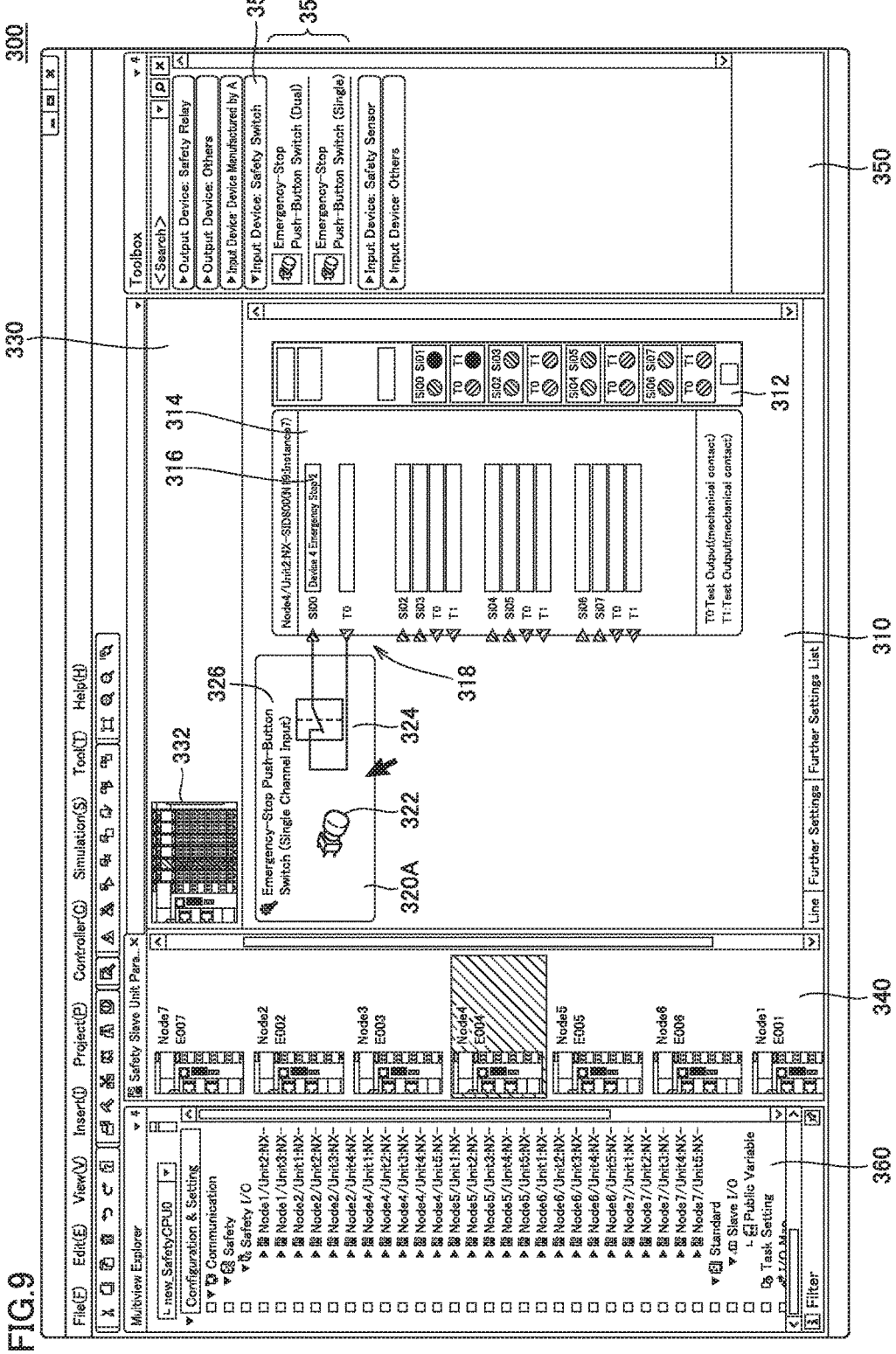

In some cases, after allocation of a certain safety device, there may be a need to change the type or the like of the allocated safety device. In order to meet such a need, a relatively simple operation may enable the type of the allocated safety device to be changed. An example of this may be as follows. As shown in FIG. 9, user's clicking of image object 320A may enable successive switching among safety devices of the same type and different characteristics. As to the change from the allocation shown in FIG. 7 to the allocation shown in FIG. 9, switching is done among the safety devices of the type "Emergency-Stop Push-Button Switch" and a change is made from the from "Dual-Channel Equivalence Input" to the form "Single Channel Input." With this change of the form, image object 322 (the external appearance of the safety device) and image object 324 (the circuit configuration of the safety device) which are displayed in image object 320A are also changed.

When there is a need to change the type of the safety device having once been allocated, the user's operation as shown in FIG. 9 may be enabled to make it possible to more easily change the type or the like of the safety device, as compared with an operation of changing the type of the safety device by deleting the safety device having been allocated and then newly selecting and allocating another safety device.

Following the I/O setting as described above, a user successively makes various settings including the allocation of a safety device to each input/output unit of the safety controller. The result of the I/O setting is stored as variable setting 154 (see FIG. 3) which is output by variable and network configuration application 150. Namely, support device 100 has a function of storing the setting regarding allocation of a safety device to a selected input/output unit.

Figure 10:
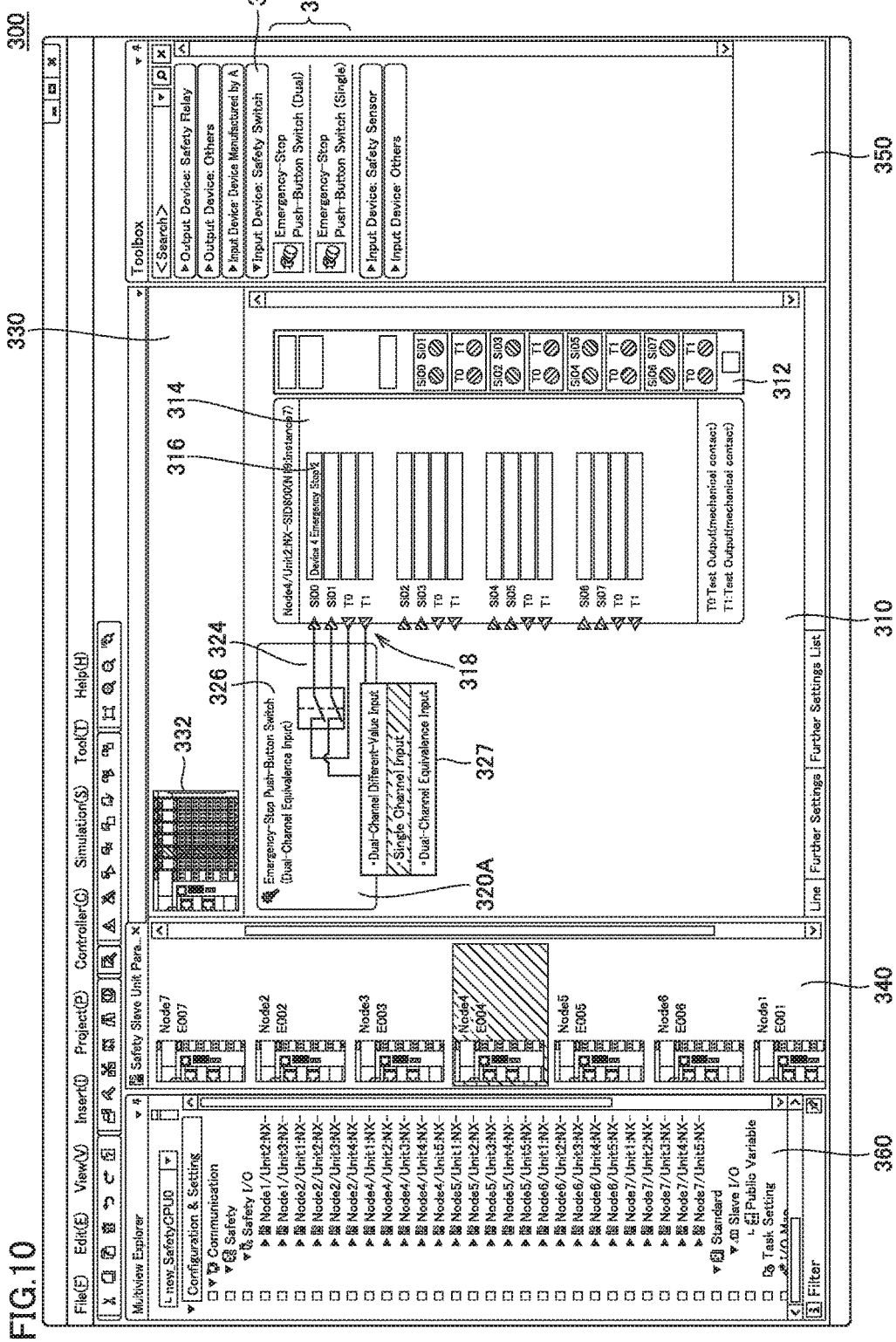

Alternatively, as shown in FIG. 10, by manipulation of image object 320A which represents a safety device having once been allocated, a sub menu 327 showing candidates for the target safety device to which the currently allocated safety device is to be changed may be displayed and a target safety device may be selected on this sub menu 327. By such an operation of changing the safety device by means of sub menu 327, the changing operation as shown in FIG. 9 is performed.

Image objects 320A to 320D each include image object 322 representing the external appearance of the safety device and image object 324 representing the circuit configuration of the allocated safety device, and only one of image object 322 and image object 324 may arbitrarily be changed. For example, some safety devices which are identical to each other in terms of functions and circuit may be different from each other in terms of the external appearance (color or size for example). In such a case, only the external appearance of the safety device, namely only image object 322, may be changed. By permitting such a flexible change of the image object, a design can be made in consideration of actual work.

<E. Document Output>

Figure 11:
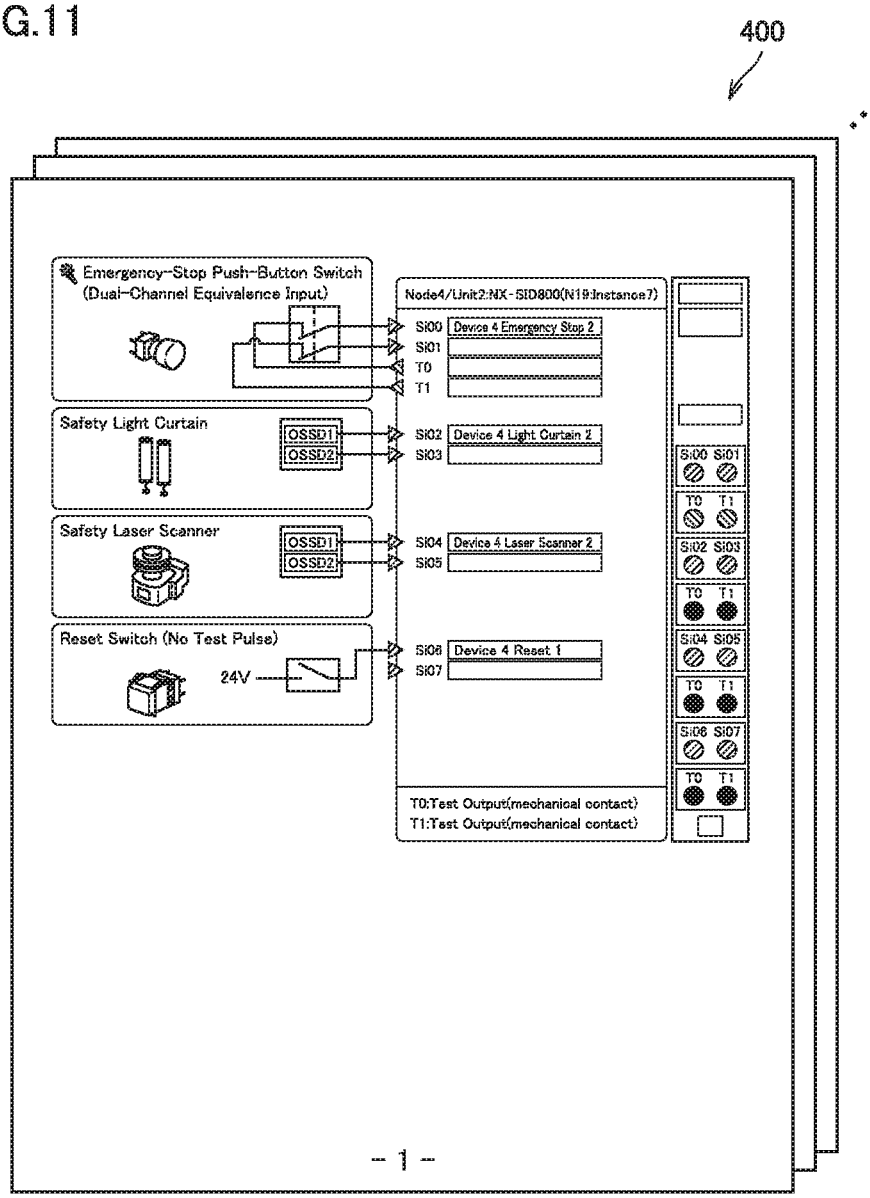
FIG. 11 is a schematic view showing an example of a document which is output from the support device in accordance with the present embodiment.

Next, a description will be given of an example of document output from support device 100 in accordance with the present embodiment. FIG. 11 shows an example of a document 400 which is output from support device 100 in accordance with the present embodiment. As shown in FIG. 11, document 400 including contents corresponding to image objects 312 and 314 is output. Thus, support device 100 has a function for outputting a document including image objects 312 and 314 (first image object) and image object 320A (second image object) as shown in FIG. 8 for example.

Document 400 can be used as a design document or a specification of the safety program. In the example shown in FIG. 11, allocation of safety devices to one input/output unit is illustrated. However, one page of the document may include information about allocation of safety devices to a plurality of input/output units.

As to the manner in which document 400 is output, document 400 may be provided as a printed matter from a printer or the like, or provided as electronic data in the form of the PDF (Portable Document Format). Processing for such output of document 400 may be performed by association module 153 (see FIG. 3) or the like of variable and network configuration application 150.

<F. Process Procedure for I/O Setting>

Figure 12:
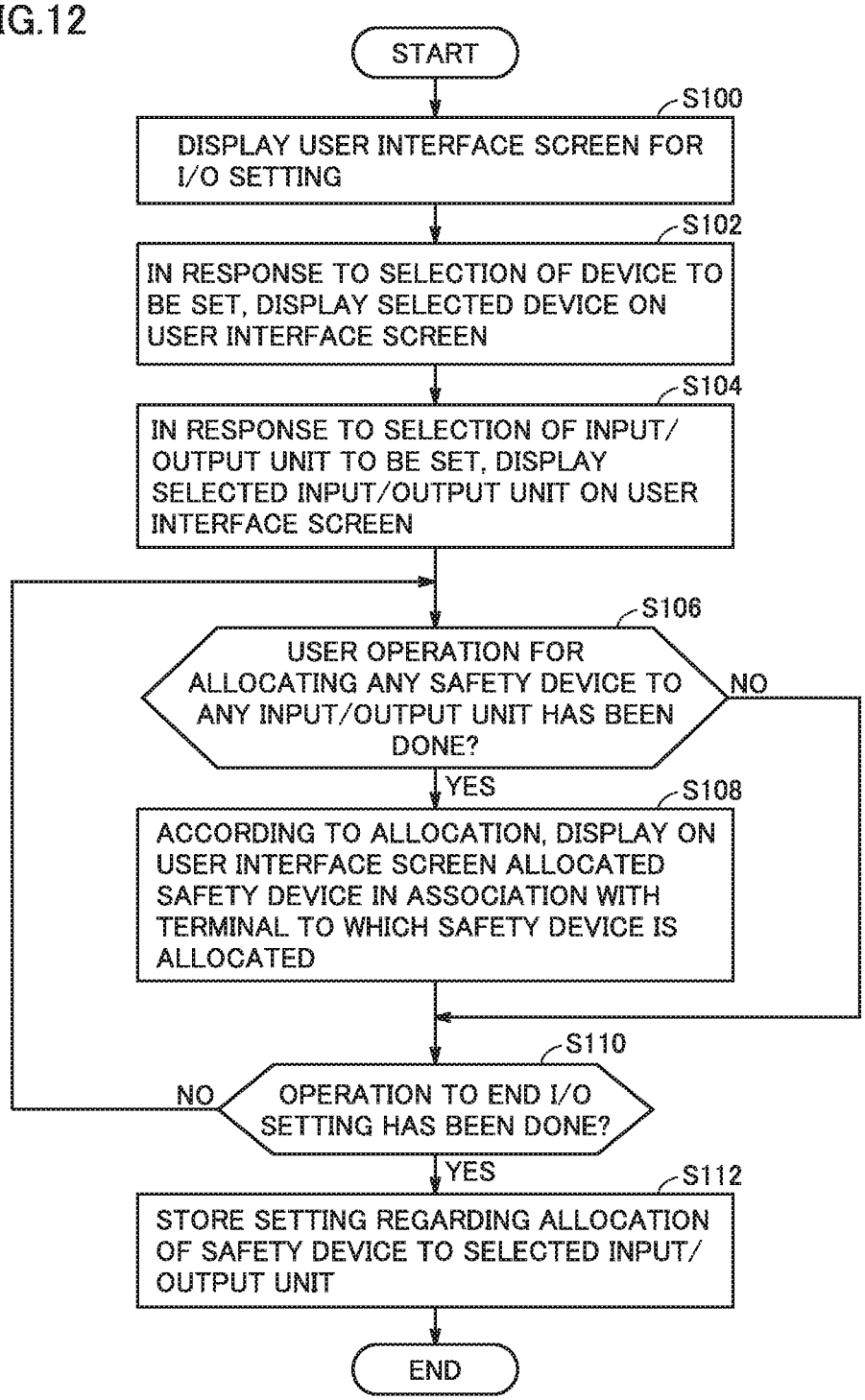
FIG. 12 is a flowchart showing a process procedure for I/O setting by the support device in accordance with the present embodiment.

Next, a process procedure for the I/O setting shown in FIGS. 4 to 10 will be described. FIG. 12 is a flowchart showing a process procedure for I/O setting by support device 100 in accordance with the present embodiment. Each step shown in FIG. 12 is implemented through execution of a program development support program (programming application 140 and variable and network configuration application 150) by processor 102.

Referring to FIG. 12, in response to a user's operation, support device 100 displays user interface screen 300 (see FIG. 4) for I/O setting (step S100). Subsequently, in response to a user's selection of a device for which the setting is to be done, support device 100 displays the selected device on user interface screen 300 (see FIG. 5)

(step S102). Subsequently, in response to a user's selection of an input/output unit for which the setting is to be done, support device 100 displays the selected input/output unit on user interface screen 300 (see FIG. 6) (step S104). Namely, in response to a selection of any input/output unit connected to the safety controller, support device 100 displays image objects 312 and 314 (first image object) representing the external appearance and input/output terminals of the selected input/output unit.

Subsequently, support device 100 determines whether or not a user's operation of allocating any safety device to any input/output unit has been performed (step S106). When a user's operation of allocating any safety device to any input/output unit has been performed (YES in step S106), support device 100 displays, in accordance with the allocation, the allocated safety device in association with terminals to which the safety device is allocated, on user interface screen 300 (see FIG. 7) (step S108). Namely, it displays, together with image objects 312 and 314 (first image object), image object 320A (second image object) representing the safety device which is set to be allocated to any input/output terminal of the selected input/output unit as well as the circuit configuration of the safety device.

After step S108 is performed or when the user's operation of allocating any safety device to any input/output unit has not been done (NO in step S106), it is determined whether or not a user's operation to end the I/O setting has been done (step S110). When the user's operation to end the I/O setting has not been done (NO in step S110), the steps are repeated from step S106.

When the user's operation to end the I/O setting has been done (YES in step S110), the setting regarding allocation of the safety device to the selected input/output unit is stored (step S112). Thus, the I/O setting for the selected input/output unit is completed.

<G. Advantages>

In accordance with the present embodiment, a safety device can be efficiently allocated to each input/output unit while the actual electrical connection or the like between the safety device and the input/output unit is confirmed. In this way, not only internal variables in software but also the electrical circuit configuration can be designed while being confirmed.

Moreover, in accordance with the present embodiment, the operation of allocating any safety device to any terminals of any input/output unit can intuitively be performed. Therefore, the safety device can more efficiently be allocated to the input/output unit.

Moreover, in accordance with the present embodiment, a document including contents similar to those of the user interface screen in the design stage is generated. Therefore, for designers as well as operators actually performing operations, the possibility of making mistakes in implementation can be reduced.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A program development support device for supporting development of a safety program to be executed in a safety controller, the program development support device comprising:

a first display control module configured to display, in response to selection of any input/output unit connected to the safety controller, a first image object representing an external appearance and input/output terminals of the selected input/output unit; and a second display control module configured to display, together with the first image object, a second image object representing an external appearance of a safety device and a circuit configuration of the safety device, the safety device being set to be allocated to any of the input/output terminals of the selected input/output unit, wherein the circuit configuration includes an internal circuit of the safety device and connection between the safety device and the allocated input/output terminals;

wherein for an input/output terminal to which each safety device is allocated, the input/output terminal represented by the first image object and the circuit configuration represented by the second image object being displayed in association with each other, wherein the first image object includes, as the external appearance of the input/output unit corresponding to the first image object, one or more partial image objects each representing an input/output terminal, and wherein the first display control module varies, depending on a type of the safety device allocated to the input/output unit, a manner of displaying a corresponding partial image object.

2. The program development support device according to claim 1, further comprising a module configured to allocate, in response to selection of any safety device from a plurality of safety devices prepared in advance, the selected safety device to an input/output terminal of the input/output unit.

3. The program development support device according to claim 1, wherein the first display control module varies a manner of displaying the input/output terminals of the first image object, depending on a type of the safety device allocated to the input/output unit.

4. The program development support device according to claim 1, wherein the one or more partial image objects are configured to represent a direction of a signal to be delivered to/from the safety device allocated to the input/output unit.

5. The program development support device according to claim 1, further comprising an output module configured to output a document including the first image object and the second image object.

6. The program development support device according to claim 1, further comprising a storage module configured to store a setting regarding allocation of the safety device to the selected input/output unit.

7. A non-transitory storage medium storing thereon a computer-readable program development support program for supporting development of a safety program to be executed in a safety controller, the program development support program causing a computer to execute:

displaying, in response to selection of any input/output unit connected to the safety controller, a first image object representing an external appearance of an external appearance and input/output terminals of the selected input/output unit; and displaying, together with the first image object, a second image object representing a safety device and a circuit configuration of the safety device, the safety device being set to be allocated to any of the input/output terminals of the selected input/output unit, wherein the circuit configuration includes an internal circuit of the safety device and connection between the safety device and the allocated input/output terminals;

wherein for an input/output terminal to which each safety device is allocated, the input/output terminal represented by the first image object and the circuit configuration represented by the second image object being displayed in association with each other, wherein the first image object includes, as the external appearance of the input/output unit corresponding to the first image object, one or more partial image objects each representing an input/output terminal, and wherein the first display control module varies, depending on a type of the safety device allocated to the input/output unit, a manner of displaying a corresponding partial image object.

8. The non-transitory storage medium according to claim 7, wherein the program development support program further causes the computer to execute allocating, in response to selection of any safety device from a plurality of safety devices prepared in advance, the selected safety device to an input/output terminal of the input/output unit.

9. The non-transitory storage medium according to claim 7, wherein the step of displaying the first image object comprises varying a manner of displaying the input/output terminals of the first image object, depending on a type of the safety device allocated to the input/output unit.

10. The non-transitory storage medium according to claim 7, wherein
the one or more partial image objects are configured to represent a direction of a signal to be delivered to/from the safety device allocated to the input/output unit.

11. The non-transitory storage medium according to claim 7, wherein the program development support program further causes the computer to execute outputting a document including the first image object and the second image object.

12. A program development support method for supporting development of a safety program to be executed in a safety controller, the program development support method comprising:
displaying, in response to selection of any input/output unit connected to the safety controller, a first image object representing an external appearance of an external appearance and input/output terminals of the selected input/output unit; and displaying, together with the first image object, a second image object representing a safety device and a circuit configuration of the safety device, the safety device being set to be allocated to any of the input/output terminals of the selected input/output unit, wherein the circuit configuration includes an internal circuit of the safety device and connection between the safety device and the allocated input/output terminals;

wherein for an input/output terminal to which each safety device is allocated, the input/output terminal represented by the first image object and the circuit configuration represented by the second image object being displayed in association with each other, wherein the first image object includes, as the external appearance of the input/output unit corresponding to the first image object, one or more partial image objects each representing an input/output terminal, and wherein the first display control module varies, depending on a type of the safety device allocated to the input/output unit, a manner of displaying a corresponding partial image object.

13. The method according to claim 12, further comprising allocating, in response to selection of any safety device from a plurality of safety devices prepared in advance, the selected safety device to an input/output terminal of the input/output unit.

14. The method according to claim 12, wherein the step of displaying the first image object comprises varying a manner of displaying the input/output terminals of the first image object, depending on a type of the safety device allocated to the input/output unit.

15. The method according to claim 12, wherein
the one or more partial image objects are configured to represent a direction of a signal to be delivered to/from the safety device allocated to the input/output unit.

16. The method according to claim 12, further comprising outputting a document including the first image object and the second image object.

17. The method according to claim 12, further comprising storing a setting regarding allocation of the safety device to the selected input/output unit.

* * * * *